United States Patent [19]
Kurihara

[11] Patent Number: 5,623,162
[45] Date of Patent: Apr. 22, 1997

[54] LEAD FRAME HAVING CUT-OUT WING LEADS

[75] Inventor: Kenichi Kurihara, Tokyo, Japan

[73] Assignee: NEC Corporation, Tokyo, Japan

[21] Appl. No.: 549,529

[22] Filed: Oct. 27, 1995

[30] Foreign Application Priority Data

Oct. 27, 1994 [JP] Japan .................................... 6-287478

[51] Int. Cl.$^6$ ................................................ H01L 23/495
[52] U.S. Cl. ........................... 257/666; 257/672; 257/674
[58] Field of Search ..................................... 257/666, 669, 257/670, 674, 787, 672

[56] References Cited

FOREIGN PATENT DOCUMENTS

| | | | |
|---|---|---|---|
| 63-133656 | 6/1988 | Japan | 257/666 |
| 1-71161 | 3/1989 | Japan | 257/666 |
| 3-276747 | 12/1991 | Japan | 257/666 |
| 4-45566 | 2/1992 | Japan | 257/690 |
| 63133656 | 10/1994 | Japan . | |

Primary Examiner—Mahshid D. Saadat
Assistant Examiner—Jhihan B. Clark
Attorney, Agent, or Firm—Sughrue, Mion, Zinn, Macpeak & Seas

[57] ABSTRACT

In a remote tie-bar lead frame 10 rising an island 4 for bearing a semiconductor chip, one pair of hanger pins 1 for supporting the island 4, a number of outwardly extending leads 2 located to surround the island 4 separately from the island 4, and a pair of tie-bars 6 for mutually tying the leads so as to prevent a flow-out of a resin when a resin packaging is carried out, one pair of wing leads 3A outwardly extend from a pair of opposite sides of the island 4 orthogonal to the pair of opposite sides from which the hanger pins 1 extends. Each of the wing leads 3A extends between a pair of adjacent leads, but terminates to slightly outwardly project from a mold line 5.

6 Claims, 9 Drawing Sheets

LEAD FRAME HAVING CUT-OUT WING LEADS

BACKGROUND OF THE INVENTION

1. Field of the Invention

The present invention relates to a lead frame, and more specifically to a lead frame having wing leads.

2. Description of the Related Art

Referring to FIG. 1, there is shown one example of a conventional lead frame, which includes an island (or die pad) 4 for bearing a semiconductor chip (not shown), a pair of hanger pins 1 extending from opposite sides of the island 4 and supporting the island 4, a number of outer leads 2A extending to the outside of a plastic or resin packaged semiconductor device, a number of inner leads 2B located inside of the resin packaged semiconductor device and extending from a proximity of the island 4 to corresponding outer leads 2A, and a pair of tie-bars 6 for tying the outer leads together and for preventing flow-out of resin when resin packaging is carried out.

In a method of manufacturing a resin packaged semiconductor device using the lead frame mentioned above, a semiconductor chip (not shown) is die-bonded on the island of the lead frame mentioned above, and then, wire bonding is carried out to interconnect each of the electrodes on the semiconductor chip and a corresponding inner lead 2B, and thereafter, the assembly thus obtained is molded or packaged with a resin in a volume defined by a mold line 5 shown in FIG. 1. In this resin packaging process, the resin flowing out between each pair of adjacent leads is blocked by the tie-bars 6, so that the resin remains in the form of a burr or flash between each pair of adjacent leads on the inside of the tie-bars 6. Furthermore, the flash between each pair of adjacent leads and the tie-bars is cut out by a cutting die. Thereafter, the outer leads are plated with a desired material, and then tip end of each output lead and the hanger pins are cut, so that the resin packaged semiconductor device is separated from the lead frame. In addition, the outer leads are shaped into a desired shape. Thus, the resin packaged semiconductor device is completed.

When the resin packaged semiconductor device manufactured as mentioned above is mounted on a printed wiring board using solder, a problem is often encountered in that, because of thermal shock at the time of mounting the resin packaged semiconductor device by immersing it into a solder dip, moisture penetrates into the resin molded body and gasifies before it is expelled from the resin molded body, such that the gasified moisture expands within the resin molded body. As a result that, a crack occurs in the resin molded body.

In order to solve this problem, for example, Japanese Patent Application Laid-open Publication JP-A-63-133656 proposed a lead frame having a wing lead as shown in FIG. 2. The disclosure of JP-A-63-133656 is incorporated by reference in its entirety into the present application. In FIG. 2, elements corresponding to those shown in FIG. 1 are given the same Reference Numerals.

As seen from a comparison of FIGS. 1 and 2, the lead frame shown in FIG. 2 includes, in addition to the hanger pins 1, a pair of extensions 11 which extend from a pair of opposite sides of the island 4 orthogonal to another pair of sides from which the hanger pins 1 extend, each of the extensions 11 extending between a pair of inner leads 2B and further between a corresponding pair of outer leads 2A to reach the tie-bar 6 and to be coupled to the tie-bar 6. The extensions 11 support the island 4, but extend between the leads. Thus, in order to distinguish the extensions 11 from the hanger pins 1, the extensions 11 are called "wing lead," in this specification.

These wing leads function to expel the moisture which penetrates the resin molded body to the outside of the resin molded body, and therefore can prevent occurrence of a crack which would otherwise occur because of the heat added at the time of mounting the resin packaged semiconductor device on the printed wiring board. Therefore, the wing leads are provided at a location where the distance between the edge of the island and the edge of the resin molded body (namely, the mold line 5) is the shortest. For example, in the lead frame shown in FIG. 2, the wing leads are provided at the center in a longitudinal direction of the resin molded body. In addition, since the wing leads also acts as an island support lead, resin molding can be carried out reliably.

However, a portion of the extension 11 positioned at the outside of the resin molded body (the outside of the mold line 5) has to be cut out since that portion is not needed for the wing lead. Therefore, the extension 11 should be cut out together with the flash between each pair of adjacent leads and the tie-bars in a conventional tie-bar cutting process in which the flash between each pair of adjacent leads and the tie-bars are cut out by a cutting die. However, in order to cut the extension 11 together with the flash between each pair of adjacent leads and the tie-bars, since the extension 11 is added to the flash between each pair of adjacent leads and the tie-bars, it is necessary to modify a punch and a die of a cutting die set to a shape capable of simultaneously cutting out not only the flash between each pair of adjacent leads and the tie-bars, but also the extensions 11. This is expensive.

On the other hand, a remote tie-bar design is known as an alternative to the conventional tie-bar design as mentioned above.

In the remote tie-bar design, a tie-bar is located at the outside of a tip end of an outer leak, instead of locating the tie-bar at a base end portion of the outer lead in the conventional tie-bar design.

Referring to FIGS. 3A and 3B, there are shown diagrammatic partial side views of resin packaged semiconductor devices, after a lead shaping step, manufactured by using the conventional tie-bar lead frame and the remote tie-bar lead frame, respectively, for the purpose of illustrating a positional relation between the tie-bar and the outer lead in the conventional tie-bar design and the remote tie-bar design. In these Figures, Reference Numeral 8 designates a resin molded body encapsulating a semiconductor chip (not shown) therein.

As shown in FIG. 3A, in the conventional tie-bar design, the tie-bar 6 is provided on a base end portion of the outer lead 2A. On the other hand, in the remote tie-bar design, as shown in FIG. 3B, the tie-bar 6 is provided at the outside of a tip end of the outer lead 2A, namely, outside of a lead cutting position, so that when the outer leads are cut, the tie-bar is cut out together with a cut-out portion 12 of the outer leads.

As mentioned hereinbefore, when a lead frame based on the conventional tie-bar design as shown in FIG. 3A is used, after the resin encapsulating, the tie-bars and the flash between each pair of adjacent leads are cut by the cutting die and removed. On the other hand, when a lead frame based on the remote tie-bar design as shown in FIG. 3B is used, since the tie-bar is located outside of the tip end of the outer lead 2A, the resin will flow out to the outside of the tip end of the outer lead 2A at the time of resin molding. After the resin molding is completed, the outer leads are cut at the lead cutting position as shown in FIG. 3B. With this cutting, the tie-bars 6 are also cut out and removed. However, the flash remains between each pair of adjacent outer leads.

As seen from the above, since the tie-bars 6 are cut out when the outer leads 2A are cut, the tie-bar removing step, which was required in the conventional tie-bar design, becomes unnecessary.

Thereafter, the flash remaining between each pair of adjacent outer leads is removed by pressure jet honing (a high pressure water blowing) or the like (deflashing).

In the remote tie-bar design, accordingly, the cutting die modified to cut out the tie-bars and the flash remaining between each pair of adjacent leads, which was required in the conventional tie-bar design, is no longer necessary, since the remote tie-bar design can remove only the flash remaining between each pair of adjacent leads, by means of pressure jet honing (a high pressure water blowing) or the like.

Therefore, if the remote tie-bar design is adopted, it becomes unnecessary to prepare a separate punching die for each kind of semiconductor devices in the manufacturing process, and the tie-bar cutting step can be eliminated since the flash remaining between each pair of adjacent leads can be carried out at the same time as the step of removing a thin flash remaining on the leads, which is conventionally performed in the prior art.

This is easily seen from a comparison of FIGS. 3A and 3B. Furthermore, in the remote tie-bar design, after the outer leads are cut, since no part of the tie-bar remains in the outer leads, the lead shaping can be easily and reliably performed.

As seen front the above, if the remote tie-bar design is adopted, both the tie-bar cutting die and the tie-bar cutting step are unnecessary, and in addition, the lead shaping is reliable, and the desired lead shape can be easily obtained. However, for example, if it is desired to provide the wing lead mentioned hereinbefore in the remote tie-bar lead frame as shown in FIG. 4 (in which elements corresponding to those shown in FIG. 1 are given the same Reference Numerals), when the outer leads 2A are cut, the tie-bars 6 are simultaneously removed. However, there remain the wing leads having the same length as that of the outer leads. The flash between each pair of adjacent leads can be removed by pressure jet honing, but it is impossible to remove an unnecessary portion of the wing lead by pressure jet honing. As a result, it becomes necessary to prepare a wing lead cutting die, and to add a wing lead cutting step. Thus, the above mentioned advantage of the remote tie-bar design will be lost, to a great extent.

In addition, in the remote tie-bar lead frame shown in FIG. 4 having wing leads, the spacing between a wing lead 3 and an outer lead 2A adjacent to the same wing lead 3 is clearly narrower than that between a pair of adjacent outer leads 2A. Therefore, when the pressure jet honing is performed to deflash or to remove the flash remaining between each pair of adjacent leads, it is difficult to remove the flash remaining between the wing lead 3 and each adjacent outer lead 2A. If the pressure jet honing process is modified to be able to remove the flash remaining between the wing lead 3 and each adjacent outer lead 2A, the outer leads 2A are deformed by the pressure jet.

In addition, independently of the remote tie-bar design, when the inner leads 2B are designed, in the case where the wing lead 3 is connected to the tie-bar 6, the position of the wing lead is determined by a wing lead cutting die, with the result that the degree of freedom in designing the inner leads 2B is restricted.

SUMMARY OF THE INVENTION

Accordingly, it is an object of the present invention to provide a lead frame which has overcome the above mentioned defects of the conventional ones.

Another object of the present invention is to provide a lead frame having wing leads for expelling moisture in a resin molded body from the resin molded body, the lead frame being capable of making a wing lead cutting die and wing lead cutting unnecessary.

Still another object of the present invention is to provide a remote tie-bar type lead frame having wing leads for expelling moisture in a resin molded body from the resin molded body, the lead frame remarkably reducing the defect rate when the pressure jet honing is performed to remove the remaining flash.

A further object of the present invention is to provide a remote tie-bar type lead frame having wing leads for expelling moisture in a resin molded body from the resin molded body, the lead frame increasing the degree of freedom in designing the inner leads.

The above and other objects of the present invention are achieved by a lead frame comprising an island for bearing a semiconductor chip, at least one hanger pin extending from the island, for supporting the island, a plurality of outwardly extending leads located to surround the island separately from the island, each of the leads having an inner lead starting from a position separated from the island and terminating at a mold line and an outer lead outwardly continuously extending from a terminating end of the inner lead, at least one tie-bar mutually tying the leads for preventing a flow-out of a resin when a resin packaging is carried out, and at least one wing lead outwardly extending from the island between a pair of adjacent leads and terminating at the mold line or slightly outwardly projecting from the mold line.

In a preferred embodiment, the tie-bar is located outside of an outer end of the outer leads.

With the above mentioned arrangement, since the wing lead outwardly extends from the island to terminate at the mold line or to slightly outwardly project from the mold line, both the wing lead cutting die and the wing lead cutting become unnecessary.

In addition, since no wing lead exists between the outer leads, when pressure jet honing is perforated to remove the remaining flash, the defect rate is remarkably reduced.

Of course, the wing lead functions to expel moisture in a resin molded body from the resin molded body, and acts as the island supporting lead.

The above and other objects, features and advantages of the present invention will be apparent from the following description of preferred embodiments of the invention with reference to the accompanying drawings.

DESCRIPTION OF THE PREFERRED EMBODIMENTS

Figure 1:
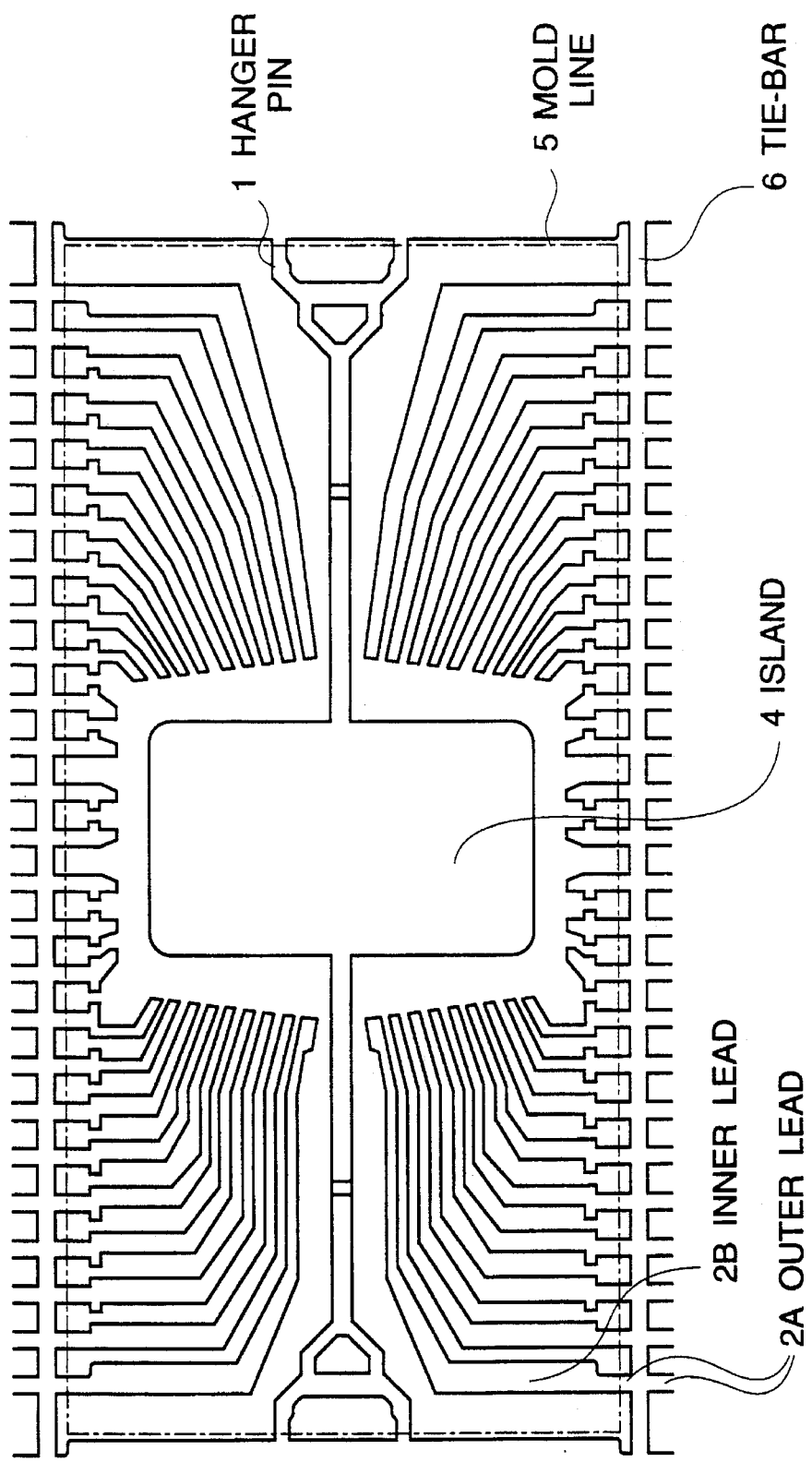
FIG. 1 is a pattern diagram of one example of a conventional lead frame.
Figure 2:
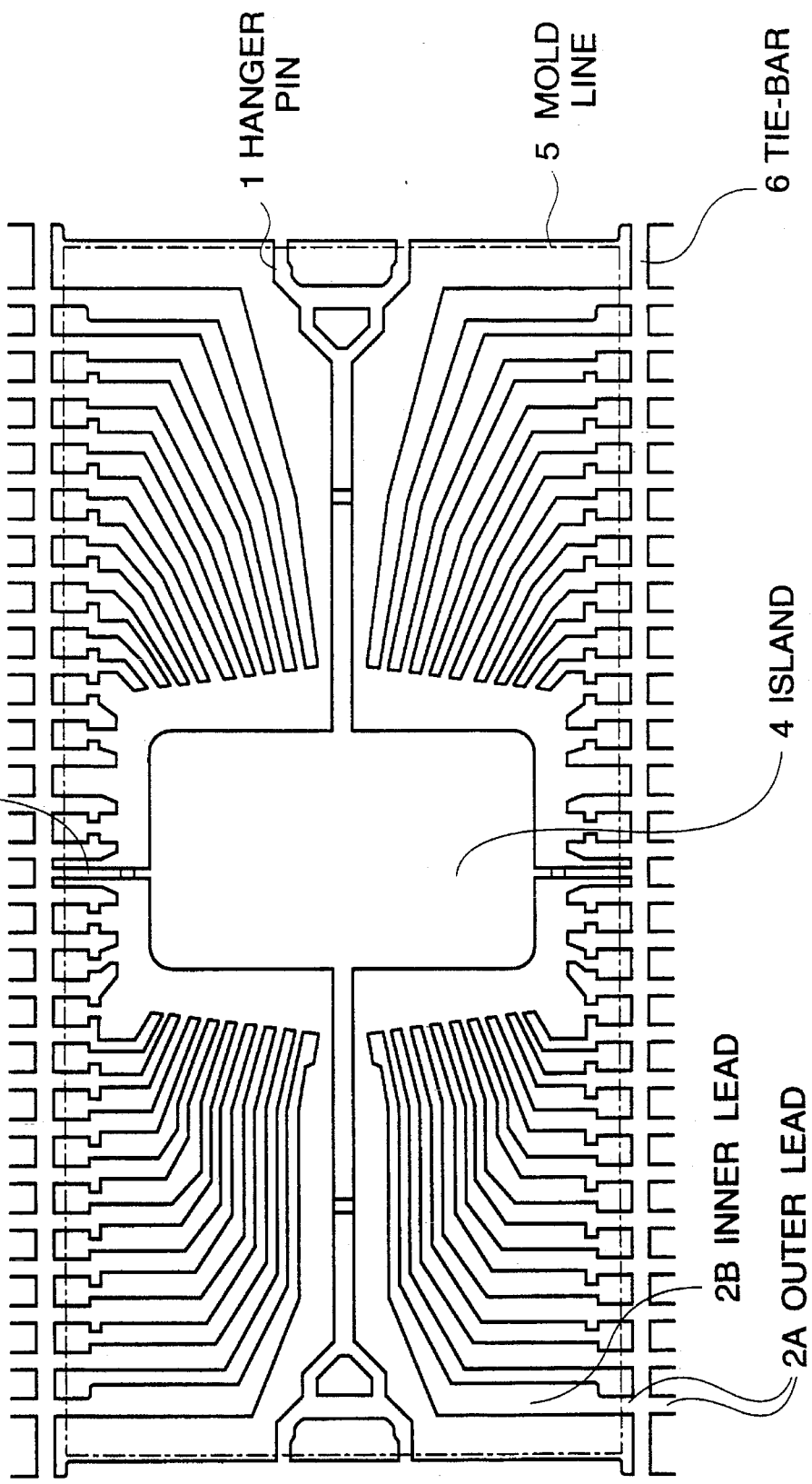
FIG. 2 is a pattern diagram of another example of a conventional lead frame, having a wing lead.
Figure 3A:
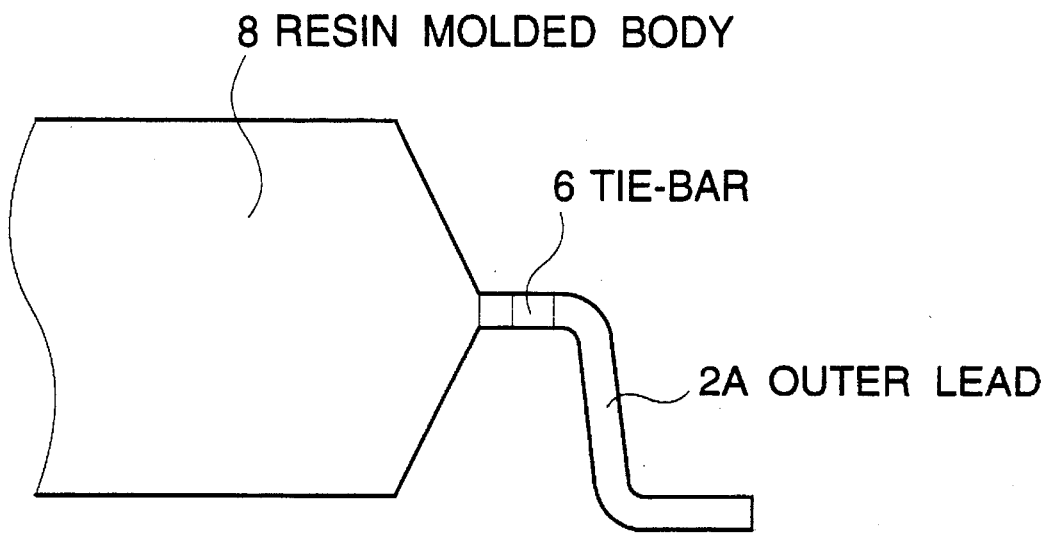
FIGS. 3A and 3B are partial side views of resin packaged semiconductor devices, after a lead shaping step, manufactured by using the conventional tie-bar lead frame and the remote tie-bar lead frame, respectively, for the purpose of illustrating a positional relation between the tie-bar and the outer lead in the conventional tie-bar design and the remote tie-bar design.
Figure 3B:
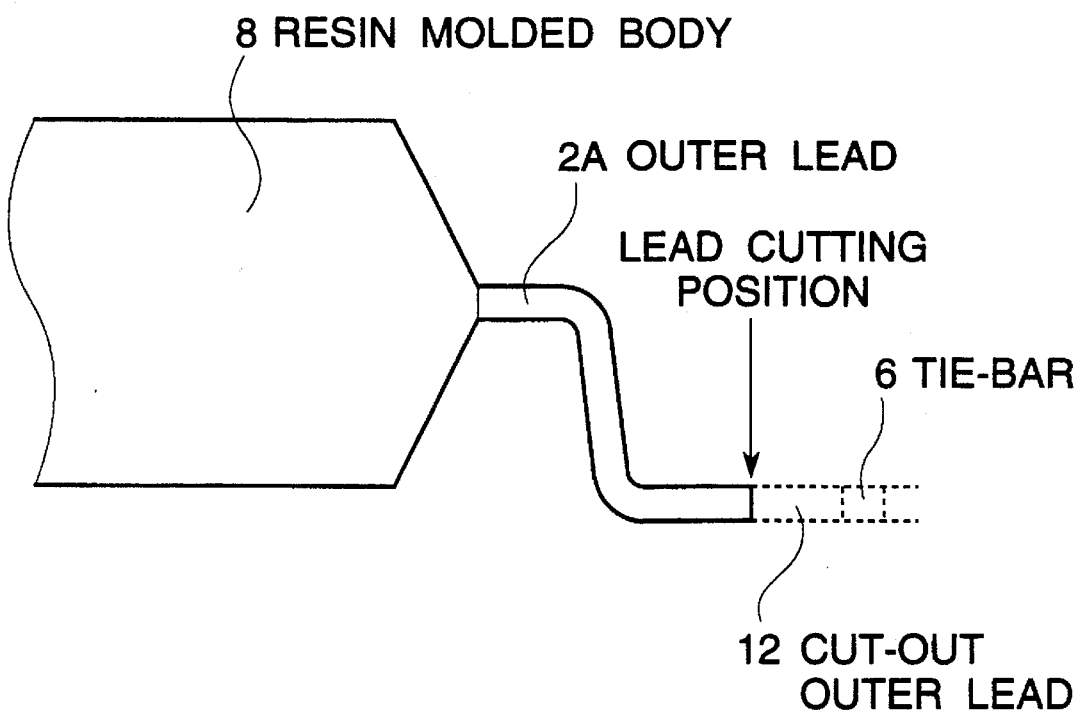
Figure 4:
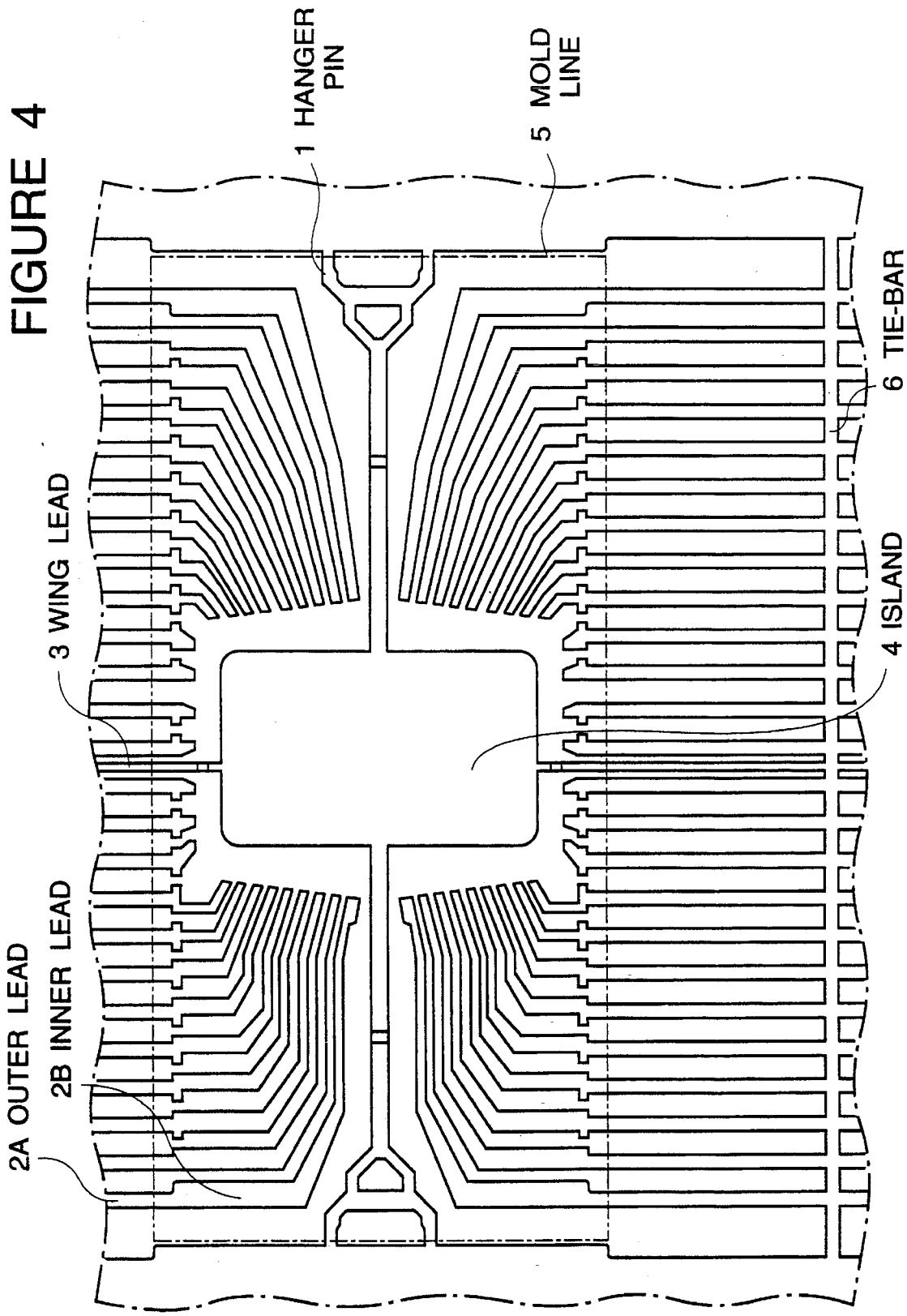
FIG. 4 is a pattern diagram of a remote tie-bar lead frame having a wing lead.
Figure 5:
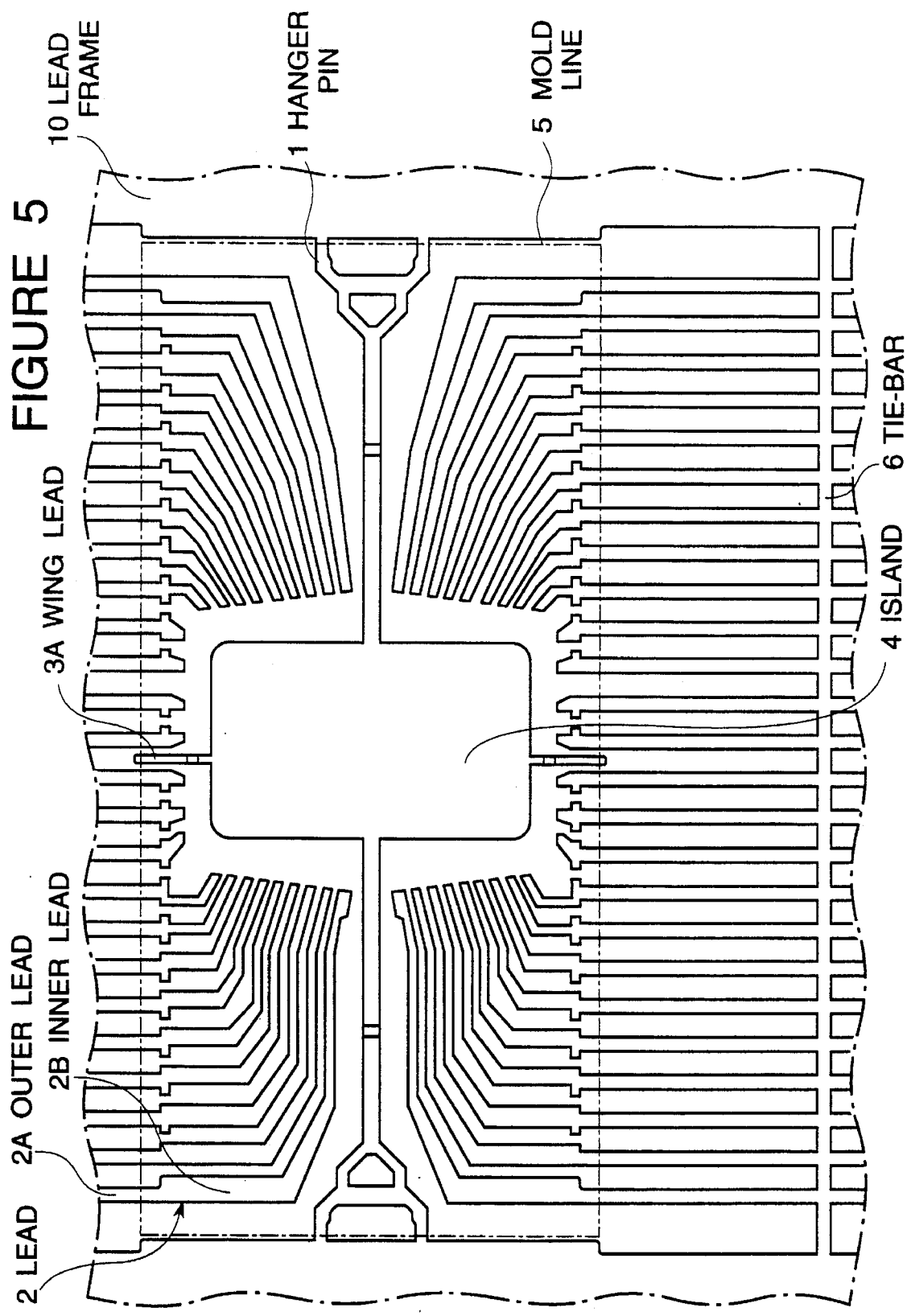
FIG. 5 is a pattern diagram of a first embodiment of a remote tie-bar lead frame in accordance with the present invention having a wing lead.

Referring to FIG. 5, there is shown a pattern diagram of a first embodiment of a remote tie-bar lead frame in accordance with the present invention having a wing lead. In FIG. 5, elements corresponding to those shown in FIGS. 1, 2 and 4 are given the same Reference Numerals.

The lead frame is generally designated by Reference Numeral 10, and comprises an island (die pad) 4 for bearing a semiconductor chip (not shown in FIG. 5), and one pair of hanger pins 1 outwardly extending from a pair of opposite sides of the island 4 to both sides of the lead frame 10, for supporting the island 4. The lead frame 10 also includes a number of outwardly extending leads 2 surrounding the island 4 and separate from the island 4. Each of the leads 2 has an inner lead 2B outwardly extending from a position separated from the island and terminating at one of a pair of side lines of a mold line 5 parallel to the hanger pins 1, and an outer lead 2A outwardly continuously extending from an outer terminating end of the inner lead 2B, parallel to the other outer leads 2A. A pair of tie-bars 6 are provided to mutually tie the outer leads 2A at an outer end of the outer leads, for preventing a flow-out of resin when resin packaging is carried out. Furthermore, one pair of wing leads 3A are formed to outwardly extend from a pair of opposite sides of the island 4 orthogonal to the pair of opposite sides from which the hanger pins 1 extend. Each of the wing leads 3A extends between a pair of adjacent leads and terminates at the mold line 5 or slightly outwardly projects from the mold line 5.

Thus, the lead frame shown of FIG. 5 is in the remote tie-bar design.

Figure 6:
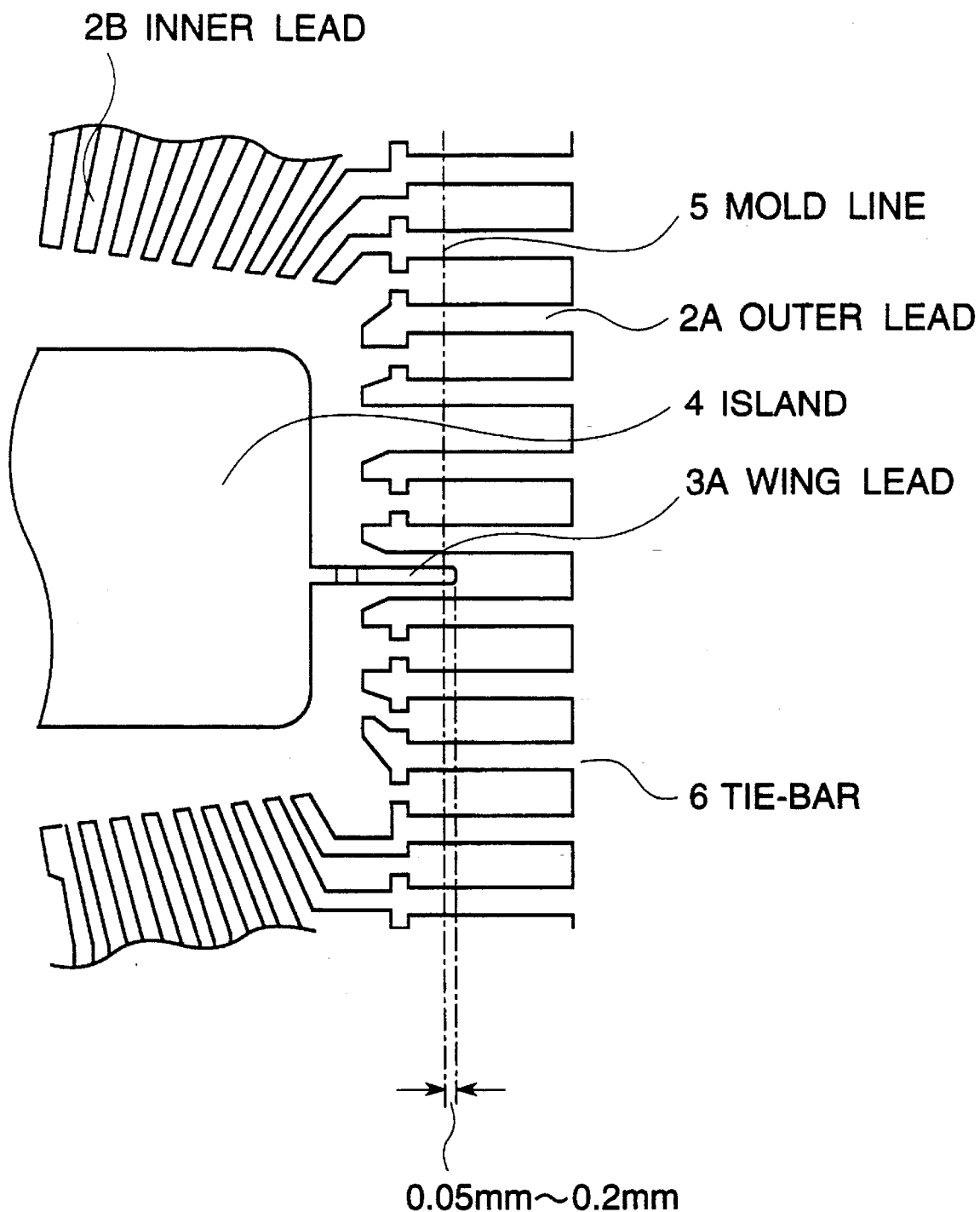
FIG. 6 is an enlarged partial pattern diagram of the remote tie-bar lead frame shown in FIG. 5.

Referring to FIG. 6, there is shown an enlarged partial pattern diagram of the lead frame shown in FIG. 5, showing one wing lead 3A and its proximity. As shown in FIG. 6, the wing lead 3A is preferred to outwardly project from the mold line 5 slightly for example, about 0.05 mm to about 0.2 min.

Figure 7:
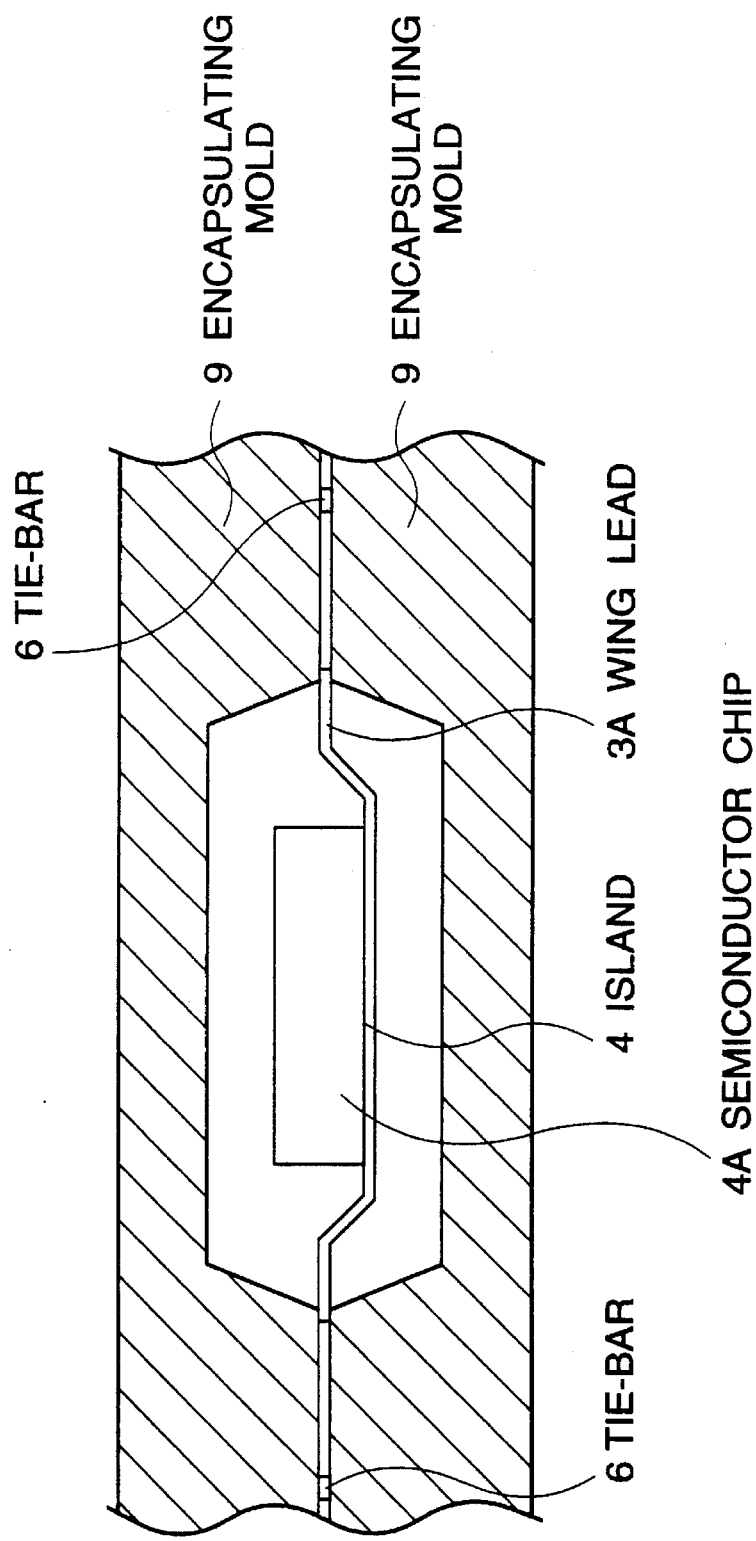
FIG. 7 is a sectional view illustrating the step of encapsulating the lead frame with resin.

Referring to FIG. 7, them is shown a sectional view illustrating the step of encapsulating the lead frame with resin. In FIG. 7, elements corresponding to those shown in FIG. 5 are given the same Reference Numerals. Reference Numeral 9 designates a pair of mutually mating encapsulating molds, and Reference Numeral 4A shows a semiconductor chip.

In a process for manufacturing a resin packaged semiconductor device, the semiconductor chip 4A is die-bonded on the island 4 of the lead frame and then wire bonding is performed to connect each of the electrodes (not shown) on the semiconductor chip 4A to a corresponding inner lead 2A. In FIG. 7, no bonding wire is shown for simplification of the drawing. Thereafter, the lead frame having the semiconductor chip 4A die-bonded on the island 4, is sandwiched between the pair of encapsulating molds 9. In this situation, the outer end of the wing lead 3A is sandwiched and pressed between the pair of encapsulating molds 9, since the wing lead 3A slightly projects from the mold line 5. In this condition, resin is supplied into a space defined between the pair of encapsulating molds 9, so that resin packaging is carried out.

In the above mentioned process, since the outer end of the wing lead 3A is sandwiched and pressed between the pair of encapsulating molds 9, the position of the wing lead is fixed, and therefore, the island holding capability is enhanced, so that reliable resin molding, which is an advantage of having the wing lead, is possible.

Figure 8:
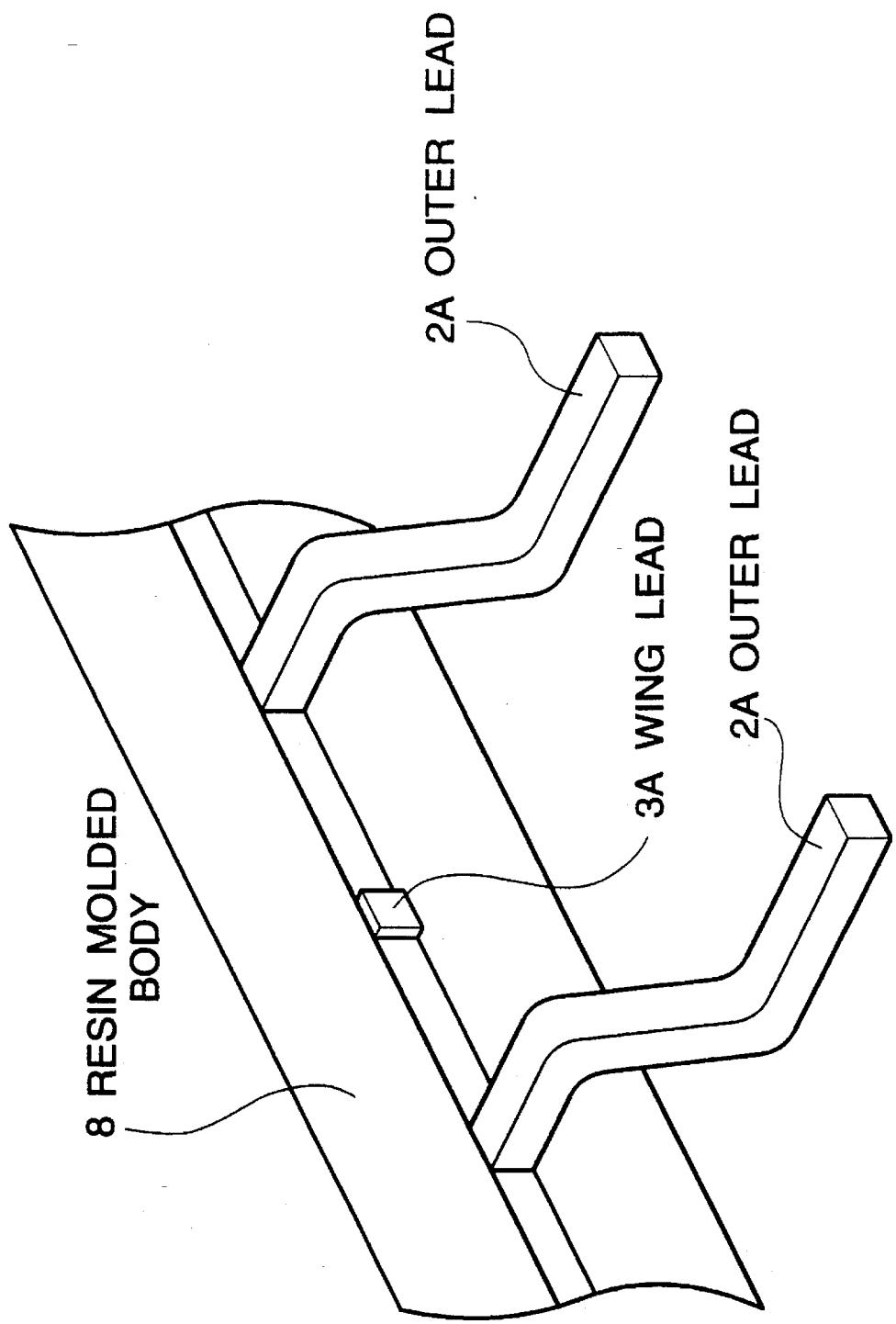
FIG. 8 is a partial perspective view of a resin packaged semiconductor device, after a lead shaping step, manufactured using the remote tie-bar lead frame in accordance with the present invention having a wing lead.

Referring to FIG. 8, there is shown a partial perspective view of the wing lead and its proximity in a resin packaged semiconductor device, after a lead shaping step, manufactured by using the remote tie-bar lead frame in accordance with the present invention having the wing lead.

As seen from FIG. 8, in the resin packaged semiconductor device, the wing lead 3 slightly projects from the resin molded body 8. The amount of projection of the wing lead 3 is on the order of 0 mm to 0.25 mm, since molding deviation is on the order of 0.05 mm in the resin molding step.

Here, if the amount of projection of the wing lead 3 is less than 0 mm, the moisture expelling path provided by the wing lead does not reach the surface of the resin molded body 8, and therefore, moisture that has penetrated the resin mold body 8 cannot be expelled. On the other hand, if the amount of projection of the wing lead 3 is larger than 0.25 mm, an automatic sensor of the resin molding machine will erroneously recognize the wing lead as being an outer lead. If the wing lead is erroneously recognized as an outer lead, an automatic sensor for discriminating the kind of product on the basis of the number of leads and others cannot operate properly.

Figure 9:
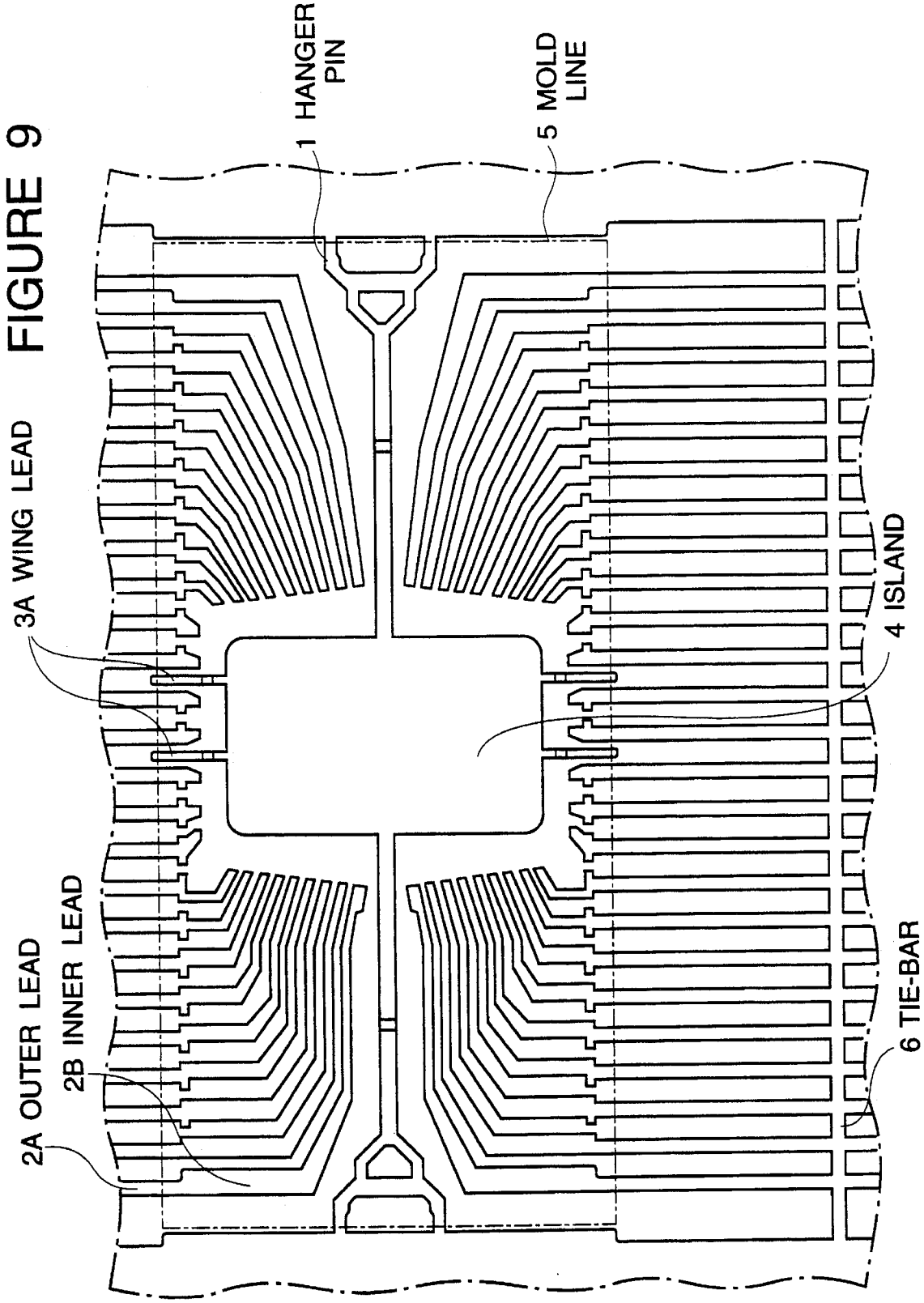
FIG. 9 is a pattern diagram of a second embodiment of a remote tie-bar lead frame in accordance with the present invention having a wing lead.

Referring to FIG. 9, there is shown a pattern diagram of a second embodiment of the remote tie-bar lead frame in accordance with the present invention. In FIG. 9, elements corresponding to those shown in FIG. 5 are given the same Reference Numerals, and explanation thereof will be omitted for simplification of the description.

As will be seen from comparison between FIGS. 5 and 9, the second embodiment includes two pairs of wing leads 3A. In this modification, the capability for holding the island 4 is further enhanced, and it becomes easier to expel the moisture in the resin molded body to the outside.

As seen from the above, the lead frame in accordance with the present invention is characterized in that the wing lead outwardly extends from the island and terminates at the mold line or projects slightly outwardly from the mold line but is never coupled to the tie-bar, so that when the resin molding is completed, the outer end of the wing lead is exposed at the surface of the resin molded body or slightly projects from the surface of the resin molded body. Therefore, even though the wing lead is incorporated in the remote tie-bar design, both the wing lead cutting die and wing lead cutting are not necessary and, the advantages inherent to the remote tie-bar design can be enjoyed.

In addition, since no wing lead exists between the outer leads, when pressure jet honing is performed to remove the remaining flash, the defect rate is remarkably reduced.

Furthermore, since both a tie-bar cutting die and a wing lead cutting die are not necessary, the position of the wing lead is never fixed before designing the inner leads, and therefore the degree of freedom in the inner lead design is increased. Additionally, since the number of wing leads can be increased, it is possible to further exploit the advantages of the wing design.

In the above mentioned embodiments, the wing lead in accordance with the present invention has been applied to the remote tie-bar lead frame, but it would be apparent to persons of working skill in the art that the wing lead in accordance with the present invention can be similarly applied to the conventional tie-bar lead frame as shown in FIG. 1.

The invention has thus been shown and described with reference to the specific embodiments. However, it should be noted that the present invention is in no way limited to the details of the illustrated structures, but changes and modifications may be made within the scope of the appended claims.

I claim:

1. A lead frame comprising:

an island for bearing a semiconductor chip, at least one hanger pin extending from said island for supporting said island, a plurality of outwardly extending leads surrounding said island and separate from said island, each of said leads having an inner lead starting from a position separated from said island and terminating at a mold line, and an outer lead outwardly continuously extending from a terminating end of said inner lead to an outer end, at least one tie-bar remote from said mold line and mutually tying said leads for preventing flow-out of a resin when resin packaging is carried out, and at least one wing lead outwardly extending from said island between a pair of adjacent leads and terminating separate from said tie-bar, at one of said mold line or slightly outward of said mold line.

2. A lead frame claimed in claim 1 wherein said tie-bar is located proximal to said outer end of said outer leads.

3. A lead frame claimed in claim 1 wherein one pair of hanger pins outwardly extend from a first pair of opposite sides of said island to two opposite sides of said lead frame, and one pair of wing leads outwardly extend from a second pair of opposite sides of said island orthogonal to said first pair of opposite sides from which said one pair of hanger pins extend.

4. A lead frame claimed in claim 1 wherein one pair of hanger pins outwardly extend from a first pair of opposite sides of said island to two opposite sides of said lead frame, and two pairs of wing leads outwardly extend from a second pair of opposite sides of said island orthogonal to said first pair of opposite sides from which said one pair of hanger pins extend.

5. A lead frame claimed in claim 2 wherein one pair of hanger pins outwardly extend from a first pair of opposite sides of said island to two opposite sides of said lead frame, and one pair of wing leads outwardly extend from a second pair of opposite sides of said island orthogonal to said first pair of opposite sides from which said one pair of hanger pins extend.

6. A lead frame claimed in claim 2 wherein one pair of hanger pins outwardly extend from a first pair of opposite sides of said island to two opposite sides of said lead frame, and two pairs of wing leads outwardly extend from a second pair of opposite sides of said island orthogonal to said first pair of opposite sides from which said one pair of hanger pins extend.

* * * * *